United States Patent [19]

Tarumoto et al.

[11] Patent Number: 4,636,285

[45] Date of Patent: Jan. 13, 1987

[54] METHOD OF MANUFACTURING WEAR RESISTANT SLIDING MEMBER

[75] Inventors: Kouji Tarumoto; Jun Miyata; Koji Yagii; Satoshi Nanba, all of Hiroshima, Japan

[73] Assignee: Mazda Motor Corporation, Japan

[21] Appl. No.: 738,433

[22] Filed: May 28, 1985

[30] Foreign Application Priority Data

May 29, 1984 [JP] Japan .................... 59-110465

[51] Int. Cl.⁴ .................... C25D 5/48; C25F 3/14; C23C 14/34
[52] U.S. Cl. .................... 204/38.5; 204/38.6; 204/129.65; 204/192.31; 418/178; 430/320
[58] Field of Search ......... 204/192 C, 192 SP, 192 N, 204/38.1, 38.6, 129.65, 38.5; 418/178; 427/259, 282, 419.1, 419.7; 430/320

[56] References Cited

U.S. PATENT DOCUMENTS

| | | | |
|---|---|---|---|
| 3,394,877 | 7/1968 | Hantzsche et al. | 230/145 |
| 3,554,677 | 1/1971 | Zapf et al. | 418/178 |
| 3,608,535 | 9/1971 | Winston et al. | 123/193 C |
| 4,056,339 | 11/1977 | Doi et al. | 418/178 |

FOREIGN PATENT DOCUMENTS

| | | | |
|---|---|---|---|
| 7309308 | 2/1974 | Netherlands | 204/129.65 |
| 661273 | 11/1951 | United Kingdom | 204/129.65 |

OTHER PUBLICATIONS

J. L. Vossen et al., *Thin Film Processes*, Academic Press, New York, 1978, pp. 48–53.
J. J. Bessot, New Vacuum Deposition Techniques, *Metal Finishing*, Apr. 1980, pp. 63–65.

*Primary Examiner*—John F. Niebling
*Assistant Examiner*—William T. Leader
*Attorney, Agent, or Firm*—Gerald J. Ferguson, Jr.; Michael P. Hoffman; Ronni S. Malamud

[57] ABSTRACT

A sliding member having a number of oil retaining pores is manufactured by forming a hard plating layer on a metal base, forming a masking resist film on the hard plating layer by exposure to light and development, forming a number of pores in the hard plating layer by effecting electrolytic etching at a current density of 50 to 600 A/dm$^2$, dissolving said masking resist film and removing the same, and forming a hard ceramic film on the hard plating layer by vapor phase plating.

6 Claims, 11 Drawing Figures

F I G.1
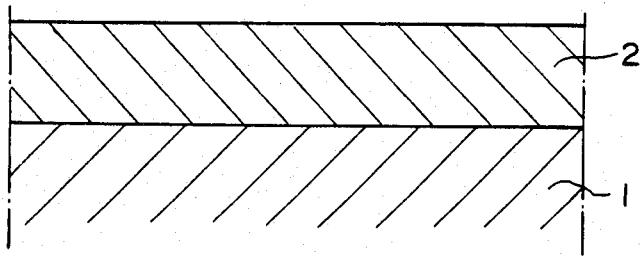
F I G.2
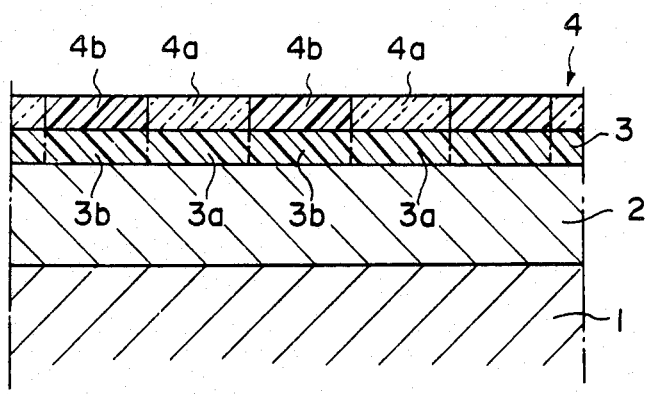
F I G.3
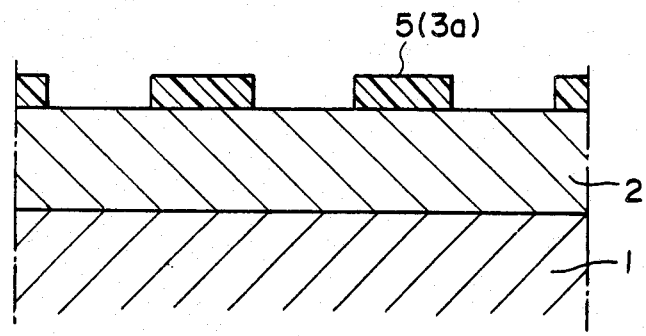

METHOD OF MANUFACTURING WEAR RESISTANT SLIDING MEMBER

BACKGROUND OF THE INVENTION

1. Field of the Invention

This invention relates to a method of manufacturing a wear resistant sliding member especially useful for manufacturing a rotor housing for a rotary piston engine and the like.

2. Description of the Prior Art

The inner surface of a rotor housing in a rotary piston engine on which an apex seal on the rotor slides at high speed must be hard and highly wear resistant. It has been known to form a hard chromium plating layer on the inner surface of the rotor housing by plating the inner surface of the rotor housing with chromium and processing the plated chromium with reverse current as disclosed in U.S. Pat. No. 4,056,339. However, there is a great demand for rotor housing exhibiting much higher wear resistance capable of withstanding even higher speed and higher output of the engine.

The applicant found that a highly wear resistant rotor housing can be obtained by forming a hard chromium plating on the inner surface of the rotor housing, processing the hard chromium plating with reverse current to make it porous and forming a hard ceramic film on the hard chromium plating by vapor phase plating such as ion plating or sputtering. By virtue of the fact that the hard ceramic film is very hard and of the oil retaining effect of the surface pores, the rotor housing exhibits a superior wear resistance.

However, further investigation by the applicant has revealed that use of reverse current processing as the method for making the hard chromium plating layer porous is disadvantageous in that uniformly distributed pores cannot be obtained and the pores are V-shaped in cross section. The V-shaped pores are small in volume and the volume is significantly reduced as the surface of the rotor housing is worn. Accordingly the oil retaining amount is small and seizing can occur due to shortage of oil especially in parts where the pore density is low.

SUMMARY OF THE INVENTION

In view of the foregoing observations and description, the primary object of the present invention is to provide a method of manufacturing a highly wear resistant sliding member having a surface which is very hard and has high oil retaining property.

Briefly, the method of the present invention is characterized in that so-called electrolytic etching process is employed as the method of making the hard plating layer porous. The electrolytic etching process is advantageous in that pores having a U-shaped cross section and accordingly having a large volume can be formed in a uniform distribution or in a desired distribution.

More particularly, the method of the present invention comprises the following steps.

As the first step, a hard plating layer is formed on a metal base. As the hard plating, there can be employed said chromium plating or, alternatively, a nickel-phosphorus plating, chromium-molybdenum plating or other plating having a surface hardness of not lower than Hv 700.

In the next (second) step, a resist film is formed on the hard plating layer for forming a mask for electrolytic etching process by exposure and development. The formation of the resist film is accomplished by use of, for example, a liquid type or film type photoresist sensitive to ultraviolet rays and a photo-mask having a predetermined pattern so that a resist film having a pattern corresponding to the pattern of the mask is formed.

In the next (third) step, electrolytic etching process is effected on the hard plating layer provided with the patterned resist film, whereby pores are formed on the exposed portion of the surface of the hard plating layer, i.e., the portion not covered with the resist film. The pores thus formed are U-shaped in cross section and are distributed over the surface of the hard plating layer in accordance with the pattern of the photo-mask.

The electrolytic etching should be effected at a current density of 50 to 600 A/dm$^2$. The current density affects the depth of the pores to be formed. When the current density is lower than 50 A/dm$^2$, etching tends to progress in a lateral direction so that the time required to form pores of a given depth is elongated. Further, the proportion of the opening area of the pores B (See FIG. 9-a) to the surface of the hard plating layer A is increased and this reduces the area of flat portion C on which the mating sliding member slides, whereby the surface pressure between the flat portion C and the mating sliding member is increased, which promotes wear of the both members. Further, since the opening area is large, desirable oil retaining property cannot be obtained. On the other hand, when the current density is higher than 600 A/dm$^2$, pores B' which are large in depth and small in opening area are formed as shown in FIG. 9-b. Such pores are desirable from the viewpoint of the oil retaining property but disadvantageous in that the shoulder angle $\theta$ at the edge portion D' between the pore B' and the flat portion C' becomes substantially 90°, thereby forming a sharp edge. When such sharp edges are formed, the hard plating layer A' tends to be cut off from the edge portion D' and a hard ceramic coating layer to be formed on the surface of the hard plating layer A' in a subsequent step is apt to be peeled off from the edge portion D', thereby promoting wear of the mating sliding member.

When the current density in the electrolytic etching process is 50 to 600 A/dm$^2$ in accordance with the present invention, there are formed pores B'' having a relatively small opening area, thereby providing excellent oil retaining property, and a relatively large shoulder angle $\theta'$ (not smaller than 100°) at the edge portion D'' as shown in FIG. 9-c.

After the electrolytic etching process is completed, the resist film formed in the second step is dissolved and removed by a predetermined solution.

Finally, a hard ceramic film having a surface hardness not lower than Hv 1000, e.g., titanium nitride, titanium carbide or the like, is formed on the hard plating layer by vapor phase plating such as ion plating or sputtering. This hard ceramic film is coated uniformly also on the inner surface of the pores formed on the surface of the hard plating layer.

Thus, there is provided in accordance with the present invention a sliding member comprising a metal base, a hard plating layer formed thereon, and a hard ceramic film formed on the hard plating layer, a large number of pores which have a relatively large shoulder angle at the edge portion and are U-shaped in cross section being formed on the surface.

BRIEF DESCRIPTION OF THE DRAWINGS

FIGS. 1 to 6 are fragmentary cross-sectional views for illustrating the condition of the product obtained in the respective steps in a method of manufacturing a sliding member in accordance with an embodiment of the present invention.

DESCRIPTION OF THE PREFERRED EMBODIMENT

Figure 4:
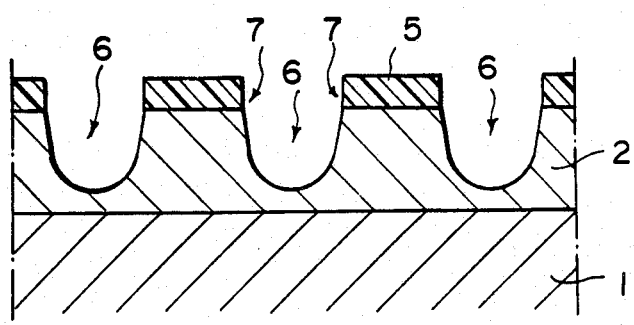

A hard chromium plating layer 2 was formed on the surface of a metal base 1 as shown in FIG. 1, and the surface of the hard chromium plating layer 2 was smoothed by honing. As the metal base 1, a casting ferrous alloy having the following composition was employed.

| C | | 0.34% | (by weight) |
|---|---|---|---|
| Si | | 1.8% | |
| Mn | | 0.7% | |
| P | not more than | 0.1% | |
| S | not more than | 0.1% | |
| Cr | | 0.2% | |
| Fe | | balance | |

Then the surface of the hard chromium plating layer 2 was covered with a liquid type photoresist 3 sensitive to ultraviolet rays (the photoresist 3 may be of film type), and a photo mask 4 having transparent portions 4a and opaque portions 4b arranged in a predetermined pattern was placed on the photoresist 3 in close contact therewith as shown in FIG. 2. Then the photoresist 3 was exposed to light. The exposed portions 3a of the photoresist 3 corresponding to the transparent portions 4a of the photo mask 4 were cured while the unexposed portions 3b of the photoresist 3 corresponding to the opaque portions 4b of the photo mask 4 were not cured. Thereafter, the photo mask 4 was removed and the photoresist 3 was developed by 1,1,1-trichloroethane, thereby eluting the unexposed portions 3b of the photoresist 3. Thus, a resist film 5 was formed on the hard chromium plating layer 2 in a pattern corresponding to the pattern of the transparent portions 4a of the photo mask 4 as shown in FIG. 3.

Figure 5:
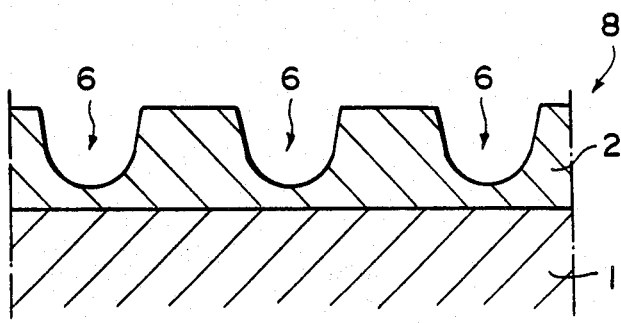

Then the hard chromium plating layer 2 bearing thereon the resist film 5 was subjected to electrolytic etching. Chromic acid solution was used as the etching agent and the electrolytic etching was accomplished at a plurality of current densities within the range of 50 to 600 A/dm² to prepare five groups of test pieces as will be described later. Thereby the portions of the surface of the hard chromium plating layer 2 not covered with the resist film 5 were etched and pores or recesses 6 were formed as shown in FIG. 4. Each pore 6 was U-shaped in cross section and had a rounded edge portion 7 having a relatively large shoulder angle (not smaller than 100°). Thereafter, the resist film 5 was dissolved and removed using dichloromethane, thereby obtaining an intermediate product 8 shown in FIG. 5.

Figure 7:
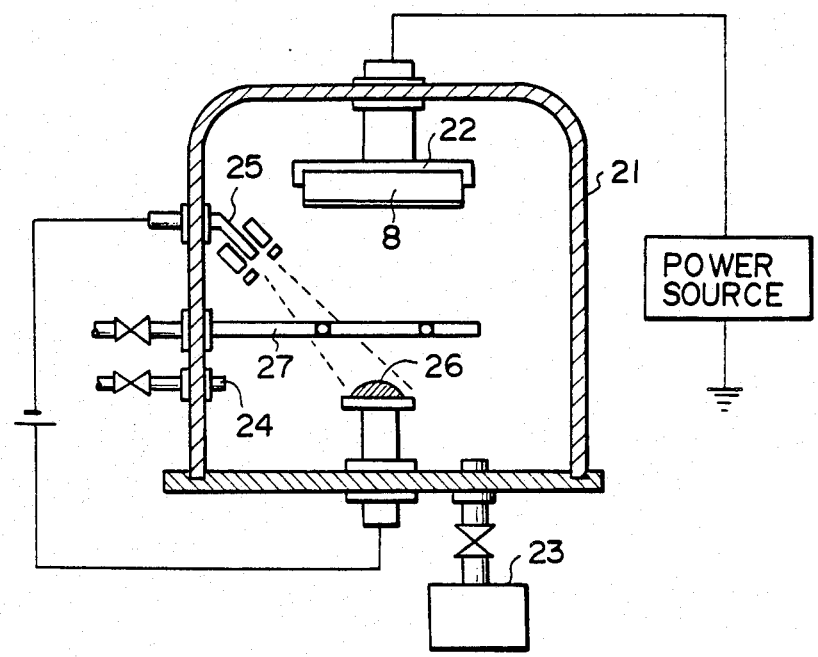
FIG. 7 is a schematic view of a reactive ion plating device employed to carry out the method of the embodiment.

Then the intermediate product 8 was completely degreased and washed and the surface of the hard chromium plating layer 2 was ion-plated using the reactive ion plating device shown in FIG. 7. That is, the intermediate product 8 was mounted on a substrate holder 22 in a vacuum container 21, and the interior of the vacuum container 21 was evacuated by a vacuum pump 23 to $10^{-5}$ Torr. The intermediate product 8 was then heated to about 200° C. by high-frequency heating. Then gaseous argon was introduced into the vacuum container 21 through a first inlet pipe 24, and at the same time, ion-bombardment was conducted for ten minutes applying by voltage of −500 V to the intermediate product 8. Thereafter, a hollow cathode discharge electron beam gun 25 was operated to heat and vaporize an evaporation source 26, which was titanium in this particular embodiment, and at the same time, gaseous nitrogen was introduced into the vacuum container 21 through a second inlet pipe 27 as a reactive gas, whereby a layer of titanium nitride (reaction product) was formed on the hard chromium plating layer 2 of the intermediate product 8. In the case that a film of carbide such as titanium carbide is to be formed by vapor phase plating, acetylene is used instead of gaseous nitrogen as the reactive gas.

Figure 6:
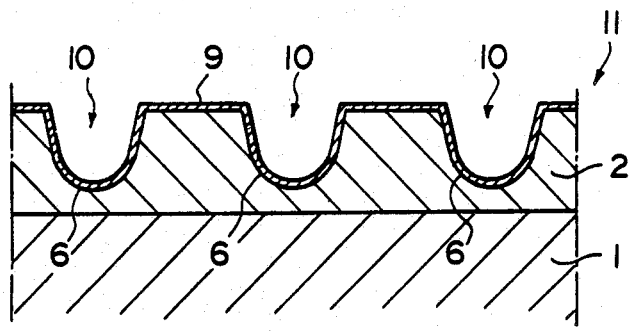

A hard ceramic (titanium nitride) film 9 was thus formed on the hard chromium plating layer 2 having a large number of pores 6 as shown in FIG. 6, and a sliding member 11 having a large number of oil retaining pores 10 (corresponding to the pores 6 in the hard chromium plating layer 2) on the surface was obtained as the final product.

A plurality of sliding members thus obtained were subjected to an attrition test using a pin on disc type device. The test pieces used in the test comprised a disklike base of casting ferrous alloy bearing thereon a 50μ-thick hard chromium plating layer 2 and a 2μ-thick titanium nitride film. The surface of the hard chromium plating layer 2 was honed. The sliding members were provided with oil retaining pores having a diameter of about 100μ and a depth of 10 to 15μ. The porosity or the proportion of the opening areas was 10 to 15% and the pores were disposed on each intersection of a mesh. The test pieces were divided into first to fifth groups depending on the current density and the electrolyzing time in the electrolytic etching process as follows.

| group No. | current density | electrolyzing time |
|---|---|---|
| No. 1 | 50 (A/dm²) | 5 min. |
| No. 2 | 100 | 2 min. |
| No. 3 | 250 | 2 min. |
| No. 4 | 500 | 30 sec. |
| No. 5 | 550 | 25 sec. |

Figure 8:
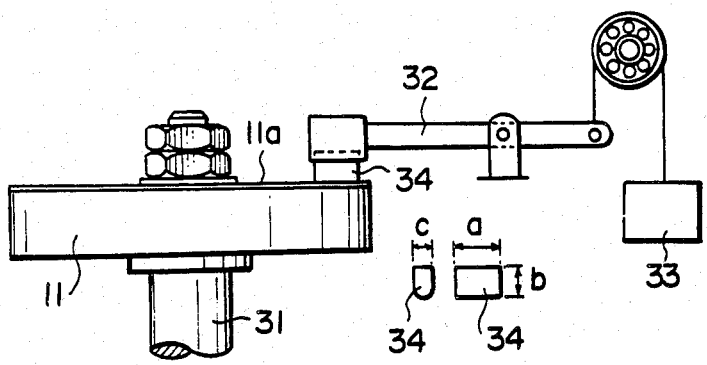
FIG. 8 is a schematic view showing a device employed for an attrition test to which the product obtained by the method of the embodiment was subjected, and FIGS. 9-a to 9-c are views for illustrating the relation between the current density at which the electrolytic etching process is carried out and the shape of pores that are formed.
Figure 9A:
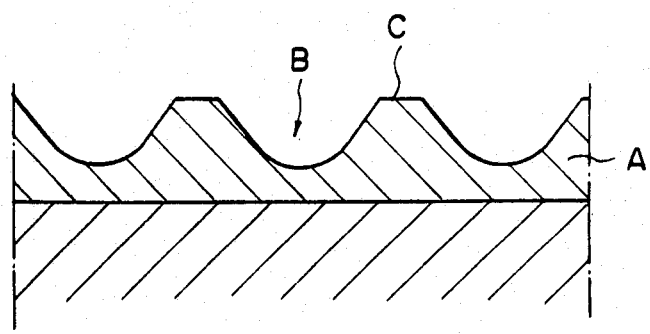
Figure 9B:
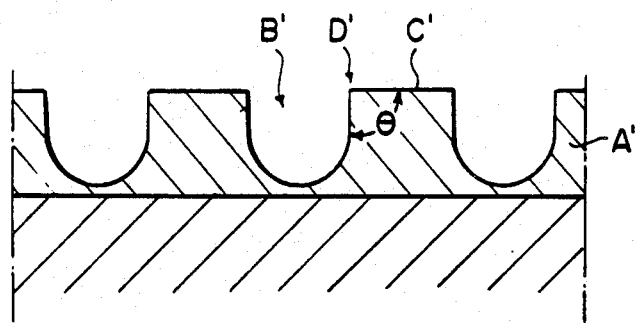
Figure 9C:
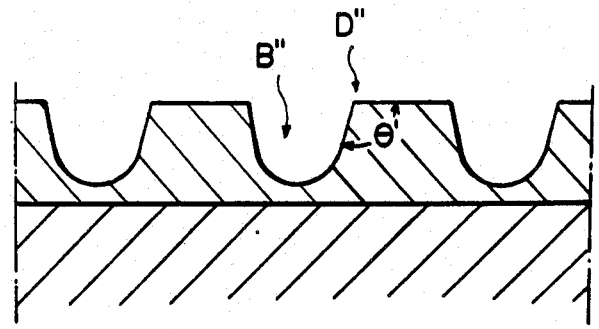

The test device was arranged as shown in FIG. 8 so that a pin 34 to which the weight of a weight 33 was imparted by way of a lever 32 was pressed against the sliding surface 11a of the test piece (the sliding member) 11 mounted on a rotary shaft 31. The pin 34 measured 10 mm in the radial direction of the test piece 11 (the size indicated at a in FIG. 8), 8 mm in height b and 3 mm in width c. The pin 34 was made of chilled casting ferrous alloy and had a rounded tip (2R). The pin pressure was 4.5 Kg, the peripheral speed of the test piece 11 was 10 m/sec, and the test time was 10 minutes. The tests were run without external lubricant in order to obtain a significant difference in a short time.

Test pieces prepared in the same manner except that the current density in the electrolytic etching process was outside the range of 50 to 600 A/dm$^2$ were subjected to the same test as first to third controls. Further, test pieces having a hard chromium plating layer 2 with pores formed by electrolytic etching process but without hard ceramic film were subjected to the same test as fourth and fifth controls. The results are shown in the following table.

TABLE

| | etching | | peel-ing*3 | wear*4 ($\mu$) | surface scuffing | surface hardness*5 |
|---|---|---|---|---|---|---|
| | (A/dm$^2$) | time | | | | |
| No. 1 EMB.*1 | 50 | 5 min. | none | 85 | less | 1450 |
| No. 2 EMB | 100 | 2 min. | none | 75 | less | 1510 |
| No. 3 EMB | 250 | 2 min. | none | 72 | less | 1480 |
| No. 4 EMB | 500 | 30 sec. | none | 80 | less | 1450 |
| No. 5 EMB | 550 | 25 sec. | none | 82 | less | 1450 |
| No. 1 CON*2 | 40 | 7 min. | none | 135 | mid. | 1525*6 |
| No. 2 CON | 650 | 20 sec. | mid. | 183 | more | 1430 |
| No. 3 CON | 1000 | 15 sec | large | 260 | more | 1515 |
| No. 4 CON | 500 | 30 sec. | — | 150 | mid. | 942 |
| No. 5 CON | 1000 | 15 sec. | — | 200 | mid. | 958 |

*1EMB = embodiment of the present invention
*2CON = control
*3peeling at the edge portion of the pore
*4scuffing in the mating sliding member
*5(Hv) measured under 50 g load
*6porosity about 30%

As can be understood from the table, in all the test pieces in accordance with the present invention, no peeling of the hard ceramic film was observed at the edge portion of the oil retaining pores, and damage on the surface of the hard ceramic film such as scuffing was relatively little. Further in the case of the test pieces of the present invention, wear in the mating sliding member (the pin 34) was relatively little. The pin 34 was made of chilled casting ferrous alloy having the following composition.

| C | 3.60 | (% by weight) |
|---|---|---|
| Si | 2.30 | |
| Mn | 0.40 | |
| P | 0.20 | |
| S | not more than 0.10 | |
| Cr | 0.50 | |
| Cu | 1.00 | |
| Mo | 1.50 | |
| Ni | 1.00 | |
| Mg | 0.01 | |
| V | 0.20 | |
| Fe | balance | |

On the contrary, in the first control which was obtained by electrolytic etching process at a current density lower than 50 A/dm$^2$, wear of the mating sliding member was promoted because of increased surface pressure due to a large porosity (about 30%) though peeling of the hard ceramic film at the edge of the pores was not observed because of a large shoulder angle at the edge portion. Further, in the second and third controls obtained by electrolytic etching at a current density higher than 600 A/dm$^2$, peeling of the hard ceramic film was relatively frequent and abrasive wear of the hard ceramic film was relatively promoted due to the peelings. Further, wear of the mating sliding member was significant. Further, in the fourth and fifth controls having no ceramic film, the surface hardness was low and accordingly scuffing of the surface was more significant than in the test pieces in accordance with the present invention, and at the same time, wear of the mating sliding member was promoted due to the sharp edge at the pores.

In order to improve the bonding strength between the hard plating layer and the hard ceramic film, a titanium layer which bonds well both to the hard plating layer and the hard ceramic layer may be formed therebetween in a thickness of 0.5 to 10$\mu$.

We claim:

1. A method of manufacturing a sliding member having a number of oil retaining pores comprising the steps of forming a hard plating layer, having a surface hardness not less than Hv 700, on a metal base, forming a masking resist film on the hard plating layer by exposure to light and development, forming a number of oil-retaining pores in the hard plating layer by effecting electrolytic etching at a current density of 50 to 600 A/dm$^2$, an edge portion of each of said oil-retaining pores having a shoulder angle not less than 100 degrees, dissolving said masking resist film and removing the same, and forming a hard ceramic film, having a surface hardness not less than Hv 1000, on the hard plating layer by vapor phase plating.

2. A method of manufacturing a sliding member as defined in claim 1 in which said hard plating is selected from the group consisting of chromium plating, nickel-phosphorus plating, and chromium-molybdenum plating, and said hard ceramic film is of titanium nitride or titanium carbide.

3. A method of manufacturing a sliding member as defined in claim 1 further comprising a step of forming a titanium layer of 0.5 to 10$\mu$ thick between said hard plating layer and the hard ceramic layer.

4. A method of manufacturing a sliding member as defined in claim 1 in which said vapor phase plating is ion plating.

5. A method of manufacturing a sliding member as defined in claim 1 in which said vapor phase plating is sputtering.

6. A method of manufacturing a sliding member as defined in claim 1 in which said sliding member is a rotor housing for a rotary piston engine.

* * * * *